US00RE45732E

(19) United States
(12) Reissued Patent
Kiyotoshi

(10) Patent Number: US RE45,732 E
(45) Date of Reissued Patent: Oct. 6, 2015

(54) NONVOLATILE SEMICONDUCTOR STORAGE DEVICE AND METHOD FOR MANUFACTURING SAME

(71) Applicant: KABUSHIKI KAISHA TOSHIBA, Tokyo (JP)

(72) Inventor: Masahiro Kiyotoshi, Mie-ken (JP)

(73) Assignee: KABUSHIKI KAISHA TOSHIBA, Tokyo (JP)

(21) Appl. No.: 14/192,277

(22) Filed: Feb. 27, 2014

Related U.S. Patent Documents

Reissue of:
(64) Patent No.: 8,124,514
Issued: Feb. 28, 2012
Appl. No.: 12/905,255
Filed: Oct. 15, 2010

U.S. Applications:
(62) Division of application No. 12/476,799, filed on Jun. 2, 2009, now Pat. No. 7,851,849.

(30) Foreign Application Priority Data

Jun. 3, 2008 (JP) ..... 2008-146188

(51) Int. Cl.
*H01L 21/22* (2006.01)
*H01L 27/115* (2006.01)

(52) U.S. Cl.
CPC .... *H01L 27/11582* (2013.01); *H01L 27/11573* (2013.01); *H01L 27/11578* (2013.01)

(58) Field of Classification Search
CPC ..... H01L 27/11573; H01L 27/11578; H01L 27/11582
USPC ..... 438/591; 257/E27.078
See application file for complete search history.

(56) References Cited

U.S. PATENT DOCUMENTS

| | | | | |
|---|---|---|---|---|
| 7,005,350 | B2 | 2/2006 | Walker et al. | |
| 7,095,650 | B2 * | 8/2006 | Motoyoshi | 365/171 |
| 2007/0252201 | A1 | 11/2007 | Kito et al. | |
| 2008/0023747 | A1 | 1/2008 | Park et al. | |
| 2008/0073635 | A1 * | 3/2008 | Kiyotoshi et al. | 257/2 |
| 2008/0203586 | A1 | 8/2008 | Bach | |
| 2009/0001442 | A1 * | 1/2009 | Ozawa et al. | 257/315 |
| 2009/0011570 | A1 * | 1/2009 | Mizushima et al. | 438/429 |

FOREIGN PATENT DOCUMENTS

JP 2007-266143 10/2007

OTHER PUBLICATIONS

Korean Office Action issued on Jan. 24, 2011 in corresponding Korean Application No. 10-2009-48724 (with an English Translation).

* cited by examiner

*Primary Examiner* — James Menefee
(74) *Attorney, Agent, or Firm* — Oblon, McClelland, Maier & Neustadt, L.L.P.

(57) ABSTRACT

A nonvolatile semiconductor storage device includes: a plurality of stacked units juxtaposed on a major surface of a substrate, each stacked unit aligning in a first direction parallel to the major surface of the substrate; and a gate electrode aligning parallel to the major surface in a second direction non-parallel to the first direction. Each of the plurality of stacked units includes a plurality of stacked semiconductor layers via an insulating layer. The plurality of stacked units are juxtaposed so that the spacings between adjacent stacked units are alternately a first spacing and a second spacing larger than the first spacing. The second spacing is provided at a periodic interval four times a size of a half pitch F of the bit line. The gate electrode includes a protruding portion that enters into a gap of the second spacing between the stacked units. A first insulating film, a charge storage layer, and a second insulating film are provided between a side face of the semiconductor layer and the protruding portion.

5 Claims, 13 Drawing Sheets

NONVOLATILE SEMICONDUCTOR STORAGE DEVICE AND METHOD FOR MANUFACTURING SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is *a reissue application of U.S. Pat. No. 8,124,514, which is* a divisional of U.S. application Ser. No. 12/476,799 filed Jun. 2, 2009 (*now U.S. Pat. No. 7,851,849*), and is based upon and claims the benefits of priority from the prior Japanese Patent Application No. 2008-146188, filed on Jun. 3, 2008; the entire contents of each of which are incorporated herein by reference.

BACKGROUND OF THE INVENTION

1. Field of the Invention

The present invention relates to a nonvolatile semiconductor storage device and a method for manufacturing the same.

2. Background Art

Nonvolatile memory typified by NAND flash memory is used widely for large-capacity data storage in mobile telephones, digital still cameras, USB memory, silicon audio, and the like. The market continues to grow due to the reduction of manufacturing costs per bit enabled by rapid downscaling. NAND flash memory in particular has a small cell surface area of $4F^2$, where F is the minimum processing dimension (the half pitch); and rapid downscaling due to the simple structure thereof is progressing. However, bit density increase of future NAND flash memory will face many issues such as limitations on the downscaling of lithography, reduced reliability due to the transistor scaling, increased fluctuation of the transistor characteristics accompanying the transistor size downscaling, limitations on operation speed due to negative effects of downscaling such as short channel effects or narrow channel effects, and so on.

Conversely, P-A 2007-266143 (Kokai) discusses technology relating to a nonvolatile semiconductor storage device in which insulating films and charge storage layers are provided around a semiconductor of a columnar configuration, and multiple recording layers are stacked. However, in the case of this structure, it is necessary to pattern the gate electrode that selects the charge storage layer into a striped configuration in a plane parallel to the substrate. Therefore, the cell surface area thereof is $6F^2$ as compared to the cell surface area of normal NAND flash memory of $4F^2$ (where F is the half pitch). Further, in the case of the structure of P-A 2007-266143 (Kokai), downscaling is constrained by manufacturing process constraints when forming a silicon plug after forming the gate electrode. Then, forming the silicon plug after the gate electrode formation constrains the materials used in the gate electrode; and it is difficult to reduce the resistance. Therefore, it is necessary to make the gate electrode thick or increase the space between adjacent cells to prevent the depletion of the electrode. Thereby, downscaling is constrained. Moreover, an operation mechanism is different than that of NAND flash memory. Therefore, conventional peripheral circuit configurations of NAND flash memory will be re-designed before diversion

SUMMARY OF THE INVENTION

According to an aspect of the invention, there is provided a nonvolatile semiconductor storage device including: a substrate; a plurality of stacked units juxtaposed on a major surface of the substrate, each stacked unit aligning in a first direction parallel to the major surface of the substrate; a gate electrode aligning parallel to the major surface in a second direction non-parallel to the first direction; a charge storage layer; a first insulating film; and a second insulating film, each of the plurality of stacked units including a plurality of stacked semiconductor layers via an insulating layer, spacings between adjacent stacked units having a first spacing and a second spacing larger than the first spacing, the first spacing and the second spacing being alternately provided, the second spacing being provided at a periodic interval four times a size of a half pitch F of the bit line of the device, the gate electrode including a protruding portion entering into a gap between the stacked units, the gap having the second spacing, the charge storage layer being provided between a side face of the semiconductor layer and the protruding portion, the first insulating film being provided between the side face of the semiconductor layer and the charge storage layer, and the second insulating film being provided between the charge storage layer and the protruding portion.

According to another aspect of the invention, there is provided a method for manufacturing a nonvolatile semiconductor storage device, the device including: a semiconductor layer; a gate electrode provided facing the semiconductor layer; a charge storage layer provided between the semiconductor layer and the gate electrode; a first insulating film provided between the semiconductor layer and the charge storage layer; and a second insulating film provided between the charge storage layer and the gate electrode, the method including: stacking to form a semiconductor layer film and an insulating layer film on a major surface of a substrate, the semiconductor layer film forming the semiconductor layer, the insulating layer film forming an insulating layer; processing the semiconductor layer film and the insulating layer film to alternately provide a first spacing and a second spacing larger than the first spacing between stacked units, by using a side wall as a mask pattern, the side wall being formed on a side face of a dummy pattern formed at a period four times a size of a half pitch F of the bit line of the device, the side wall aligning in a first direction parallel to the major surface, the stacked units including the semiconductor layer and the insulating layer; forming a film forming the first insulating film, a film forming the charge storage layer, and a film forming the second insulating film on a side face of the stacked unit on the second spacing side, and further forming a gate electrode film forming the gate electrode on the film forming the second insulating film and on a major surface of the stacked unit; and processing the gate electrode film into a band configuration aligning in a second direction parallel to the major surface and non-parallel to the first direction.

DETAILED DESCRIPTION OF THE INVENTION

Figure 1A:
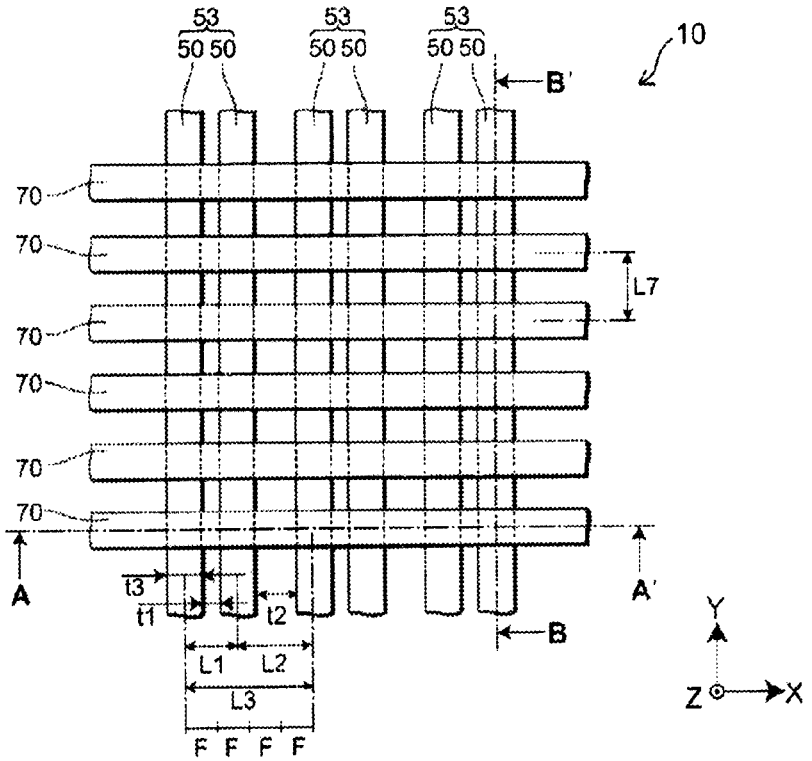
FIGS. 1A to 1C are schematic views illustrating a configuration of a nonvolatile semiconductor storage device according to a first embodiment of the present invention.

Embodiments of the present invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described in regard to a drawing thereinabove are marked with like reference numerals, and a detailed description is omitted as appropriate.

First Embodiment

Figure 1B:
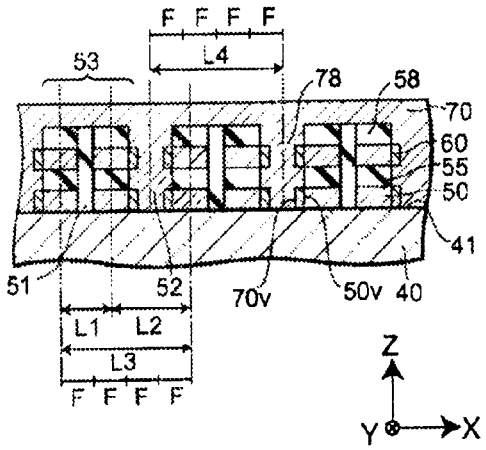
Figure 1C:
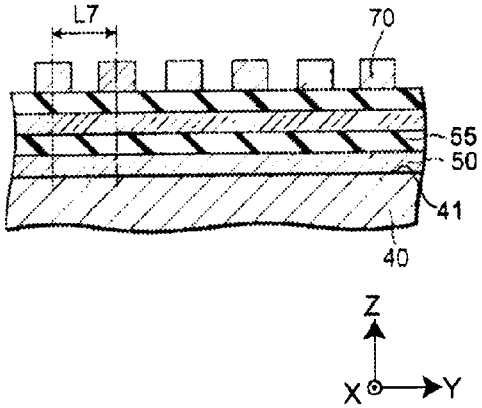

FIGS. 1A to 1C are schematic views illustrating a configuration of a nonvolatile semiconductor storage device according to a first embodiment of the present invention.

That is, FIG. 1A is a plan view, FIG. 1B is a cross-sectional view along line A-A' of FIG. 1A, and FIG. 1C is a cross-sectional view along line B-B' of FIG. 1A.

As illustrated in FIGS. 1A to 1C, a nonvolatile semiconductor storage device 10 according to the first embodiment of the present invention includes a semiconductor layer 50, a gate electrode 70 provided to face the semiconductor layer 50, a charge storage layer 60 provided between the semiconductor layer 50 and the gate electrode 70, a first insulating film (not illustrated) provided between the semiconductor layer 50 and the charge storage layer 60, and a second insulating film (not illustrated) provided between the charge storage layer 60 and the gate electrode 70. In other words, the nonvolatile semiconductor storage device 10 is a memory including a MONOS (Metal Oxide Nitride Oxide Semiconductor) structure.

The semiconductor layer 50 aligns in a first direction (for example, an X-axis direction) parallel to a major surface 41 of a substrate 40, is multiply stacked on the substrate 40 via an insulating layer 55, and is multiply provided in a plane parallel to the major surface 41 with a spacing therebetween alternately arranged to be a first spacing 51 and a second spacing 52 larger than the first spacing 51.

The second spacing 52 is arranged at a period L4 which is four times the size of a half pitch F of the bit line of the nonvolatile semiconductor storage device 10. The half pitch F is described below.

Such a configuration can be formed by using a mask pattern formed by a side wall formed on a side face of a dummy pattern formed at a period four times the size of the half pitch F, and alternately arranging the spacing of the semiconductor layers 50 to be the first spacing 51 and the second spacing 52 which is larger than the first spacing 51. A method for forming the first spacing 51 and the second spacing 52 by utilizing the side wall is described below.

On the other hand, the gate electrode 70 is provided parallel to the major surface 41 to align in a second direction (for example, a Y-axis direction) non-parallel to the first direction (the X-axis direction). A portion of the gate electrode 70 enters into the second spacing 52 side of the semiconductor layers 50 to form a protruding portion 78. The gate electrode 70 has a single period, that is, is arranged at a distance L7. For example, the distance L7 may be twice the size of the half pitch F. In other words, the gate electrode 70 is arranged, for example, at a period twice the size of the half pitch F of the word line of the device.

The charge storage layer 60 is provided between a face 50v of the semiconductor layer 50 on the second spacing 52 side perpendicular to the major surface 41 and a face 70v of the gate electrode 70 perpendicular to the major surface 41.

As illustrated in FIGS. 1A to 1C, a Z axis is a direction perpendicular to the major surface 41 of the substrate 40; the X axis is an axis perpendicular to the Z axis; and the Y axis is a direction perpendicular to the Z axis and the X axis.

In this example, the stacked semiconductor layers 50 are multiply provided in the X-axis direction and align in band configurations. The spacing between the semiconductor layers 50 includes a narrow portion (the first spacing 51) and a wide portion (the second spacing 52). The gate electrode 70 aligns to intersect with the semiconductor layer 50. The first insulating film, the charge storage layer 60, and the second insulating film are provided between a side face of the semiconductor layer 50 and a side face of the gate electrode 70. In other words, the charge storage layers 60 which form memory cells (also referred to as "cells") of the nonvolatile semiconductor storage device 10 are stacked in both the direction perpendicular to the major surface 41 of the substrate 40 and directions parallel thereto.

In other words, the nonvolatile semiconductor storage device 10 according to this embodiment includes the substrate 40, the multiple stacked units 58 juxtaposed on the major surface 41 of the substrate 40 such that each aligns in the first direction parallel to the major surface 41 of the substrate 40, and the gate electrode 70 aligning parallel to the major surface 41 in the second direction non-parallel to the first direction. Each of the multiple stacked units 58 includes multiple semiconductor layers 50 stacked via the insulating layer 55. The multiple stacked units 58 are juxtaposed such that the spacing between adjacent stacked units 58 is alternately provided as the first spacing 51 and the second spacing 52 which is larger than the first spacing 51. The second spacing 52 is provided at a periodic interval four times the size of the half pitch F of the bit line of the nonvolatile semiconductor storage device 10. The gate electrode 70 includes the protruding portion 78 which enters into the gap of the second spacing 52 between the stacked units 58. The nonvolatile semiconductor storage device 10 further includes the charge storage layer 60 provided between the side face 50v of the semiconductor layer 50 and the protruding portion 78, the first insulating film (not illustrated) provided between the side face 50v of the semiconductor layer 50 and the charge storage layer 60, and the second insulating film (not illustrated) provided between the charge storage layer 60 and the protruding portion 78.

The nonvolatile semiconductor storage device 10 according to this embodiment having such a structure provides a nonvolatile semiconductor storage device that has few constraints on miniaturization, is easy to manufacture, and does not require drastic modifications to the peripheral circuit.

Although six semiconductor layers 50 and six gate electrodes 70 are illustrated in FIGS. 1A to 1C, the present invention is not limited thereto. The numbers of semiconductor layers 50 and gate electrodes 70 are arbitrary. Although two of the semiconductor layers 50 are stacked via the insulating layer 55, the number of stack layers of the semiconductor layer 50 is arbitrary.

In the configuration recited above, the semiconductor layer 50 is periodically arranged with the wide spacing and the narrow spacing. Therefore, it is easy to provide the first insulating film, the charge storage layer 60, and the second insulating film on the wide spacing (the second spacing) side.

For example, in the case where the semiconductor layers 50 are provided with a single spacing, it is difficult to set aside space to provide the first insulating film, the charge storage layer 60, and the second insulating film recited above in the spacing therebetween and miniaturize the element. For example, generally, the half pitch F of a nonvolatile semiconductor storage device is established based on the minimum processing dimension of the semiconductor manufacturing step. F is reduced when attempting to increase the bit density of the nonvolatile semiconductor storage device. In such a case, the first insulating film, the charge storage layer 60, the second insulating film, the protruding portion 78, the second insulating film, the charge storage layer 60, and the first insulating film must be provided in a gap having a width of the half pitch F. Therefore, it is extremely difficult to reduce F.

Conversely, in the nonvolatile semiconductor storage device 10 according to this embodiment, the spacing between the semiconductor layers 50 is provided to be the narrow first spacing 51 and the wide second spacing 52. Thereby, the second spacing 52 can be made larger than the half pitch F of the bit line; and it is relatively easy to set aside space to provide the first insulating film, the charge storage layer 60, the second insulating film, the protruding portion 78, the second insulating film, the charge storage layer 60, and the first insulating film recited above in the gap on the wide second spacing side.

As illustrated in FIGS. 1A to 1C, the spacing between the semiconductor layers 50 includes a portion of a distance t1 (the first spacing 51) and a portion of a distance t2 (the second spacing 52) larger than the distance t1 alternately arranged. The width of the semiconductor layer 50, that is, a width t3, may essentially be constant.

The semiconductor layer 50 is arranged at a narrow pitch L1 and a wide pitch L2. Here, narrow pitch L1=distance t1+width t3, and wide pitch L2=distance t2+width t3. A semiconductor layer pair 53 is arranged at a pair pitch L3, where the semiconductor layer pair 53 is a pair of semiconductor layers 50 arranged with a spacing of the distance t1. At this time, pair pitch L3=narrow pitch L1+wide pitch L2=distance t1+distance t2+2×width t3. Then, a pitch L4 of the second spacing 52 is equal to the pair pitch L3.

The first spacing (the distance t1) may be provided at a period of 4F, where F is the half pitch of the bit line of the nonvolatile semiconductor storage device 10. The second spacing (the distance t2) also may be provided at a period (L4) of 4F. The semiconductor layer pair 53 also may be provided at a period of 4F. In other words, the pair pitch L3 recited above may be 4F.

At this time, the spacing, i.e., the distance t1, between the pair of the semiconductor layers 50 forming the semiconductor layer pair 53 may be set smaller than F. The spacing, i.e., the distance t2, between adjacent semiconductor layer pairs 53 may be set larger than F.

However, the nonvolatile semiconductor storage device 10 according to this embodiment is not limited thereto. It is sufficient that the semiconductor layer pair 53 is provided at the period of 4F, the distance t2 is set larger than F, and the charge storage layer 60 is disposed between the semiconductor layer pairs 53 having a spacing of the distance t2, that is, on the second spacing 52 side.

Similar to the semiconductor layer 50, the gate electrode 70 aligning in the second direction also may be formed such that the spacing between the gate electrodes 70 has a narrow portion and a wide portion. Thereby, a connection portion between the gate electrode 70 and the peripheral circuit, for example, may be provided on the wide spacing side to easily provide a connection. Hereinbelow, the description assumes the case where the gate electrode 70 is provided at a single period, that is, an example in which the distance L7 is 2F.

The half pitch F of the nonvolatile semiconductor storage device 10 according to this embodiment will now be described. Hereinbelow, the description assumes that the same half pitch is used in both the X-axis direction and the Y-axis direction.

Figure 2:
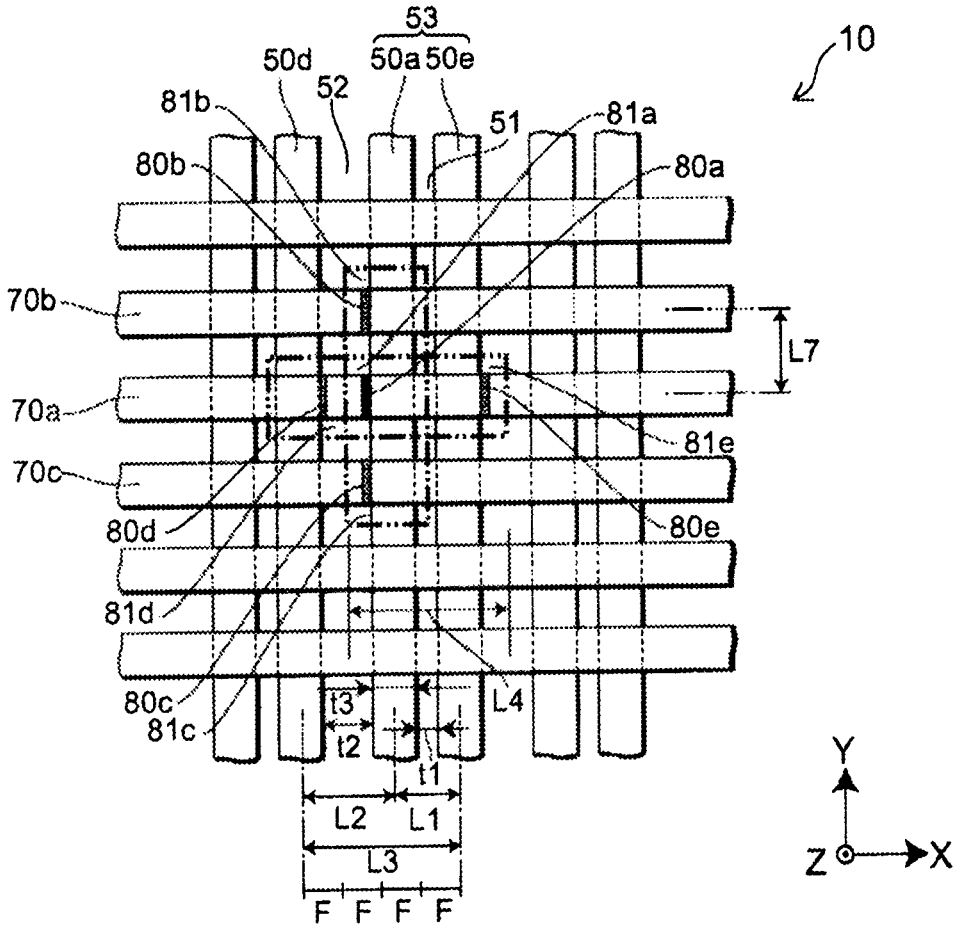
FIG. 2 is a schematic plan view illustrating the half pitch of the nonvolatile semiconductor storage device according to the first embodiment of the present invention.

FIG. 2 is a schematic plan view illustrating the half pitch of the nonvolatile semiconductor storage device according to the first embodiment of the present invention.

In the nonvolatile semiconductor storage device 10 according to this embodiment illustrated in FIG. 2, the semiconductor layer pair 53 formed by two semiconductor layers 50 juxtaposed with the narrow first spacing 51 (t1) is juxtaposed at the pair pitch L3, that is, the period of 4F. On the other hand, the gate electrode 70 is juxtaposed at a period of 2F.

As illustrated in FIG. 2, one memory cell 80a corresponds to a portion where one semiconductor layer 50a and one gate electrode 70a intersect. Now focusing on the memory cell 80a including a charge storage layer provided between a side face of the semiconductor layer 50a and a side face of the gate electrode 70a, an occupied surface 81a occupied by the memory cell 80a has a surface area S. In this case, as illustrated in FIG. 2, four memory cells 80b, 80c, 80d, and 80e are adjacent to the memory cell 80a. The memory cells 80b, 80c, 80d, and 80e also have occupied surfaces 81b, 81c, 81d, and 81e that have the same surface area S as the memory cell 80a.

In this case, boundaries between the occupied surface 81a of the memory cell 80a and occupied surfaces of memory cells adjacent in the X-axis direction may be, for example, a center line between the semiconductor layer 50a of the memory cell 80a and an adjacent semiconductor layer 50b, and a center line between the semiconductor layer 50a and another adjacent semiconductor layer 50c.

Similarly, boundaries between the occupied surface 81a of the memory cell 80a and occupied surfaces of adjacent memory cells adjacent in the Y-axis direction may be, for example, a center line between the gate electrode 70a of the memory cell 80a and an adjacent gate electrode 70b, and a center line between the gate electrode 70a and another adjacent gate electrode 70c.

The region enclosed by these four center lines may define the occupied surface 81a of the memory cell 80a.

In the nonvolatile semiconductor storage device 10, the period of the semiconductor layer pair 53 is 4F, and the period of the gate electrode 70 is 2F, and therefore the relationship $2\times S=2F\times 4F$, that is, $S=4F^2$ holds.

A method for constructing the semiconductor layer 50 and the insulating layer 55 thus including a spacing therebetween having a narrow portion and a wide portion will now be schematically described. To simplify the description, the case is illustrated where only two layers of each of the semiconductor layer 50 and the insulating layer 55 are used. Hereinbelow, the case is described where F is 25 nm.

FIGS. 3A to 3E are schematic cross-sectional views in order of the steps, illustrating main components of a method for manufacturing the nonvolatile semiconductor storage device according to the first embodiment of the present invention.

Figure 3A:
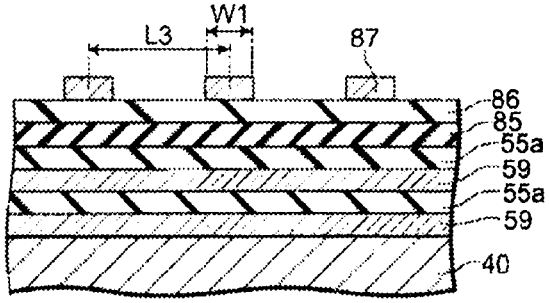
FIGS. 3A to 3E are schematic cross-sectional views in order of the steps, illustrating main components of a method for manufacturing the nonvolatile semiconductor storage device according to the first embodiment of the present invention.

First, as illustrated in FIG. 3A, two alternating layers of a semiconductor layer film 59 which forms the semiconductor layers 50 and an insulating layer film 55a which forms the insulating layers 55, a CVD-deposited silicon oxide film 85 which forms a hard mask, and a silicon nitride film 86 are formed on the substrate 40. Lithography is used to form a resist mask pattern 87 having a pitch of L3 (equal to 4F, that is, 100 nm) and a width W1 of, for example, 30 nm.

Figure 3B:
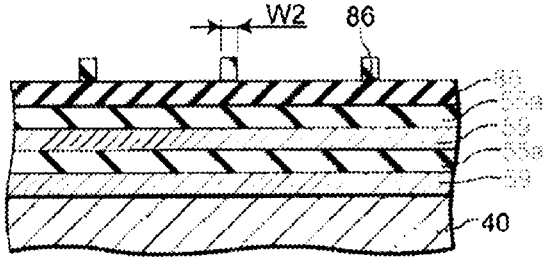

As illustrated in FIG. 3B, hot phosphoric acid processing is performed on the silicon nitride film 86, and the silicon nitride film 86 is slimmed (its profile is reduced) and patterned to a width W2 of, for example, 15 nm.

Figure 3C:
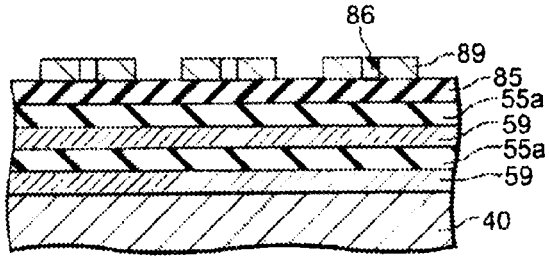

Then, as illustrated in FIG. 3C, an amorphous silicon film 89 is formed on the entire surface of the substrate 40 with a thickness of 20 nm. Reactive ion etching is then performed and the amorphous silicon film 89 is left only on side walls of the silicon nitride film 86.

Figure 3D:
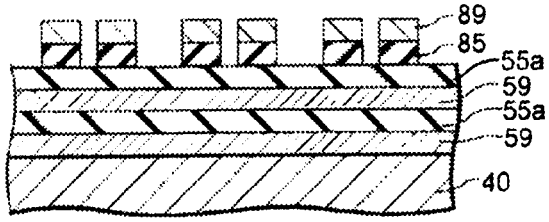

Continuing as illustrated in FIG. 3D, hot phosphoric acid processing is performed to remove the silicon nitride film 86. The CVD-deposited silicon oxide film 85 is patterned using the amorphous silicon film 89 as a mask.

Figure 3E:
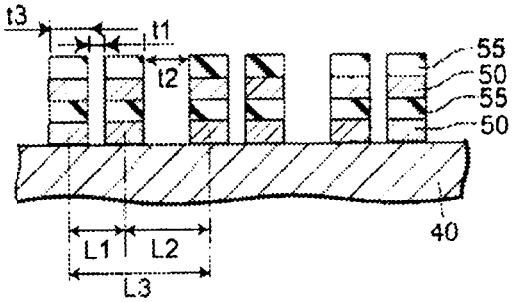

Then, as illustrated in FIG. 3E, the amorphous silicon film 89 is removed and a hard mask is formed by the CVD-deposited silicon oxide film 85. The hard mask is used to pattern the two layers of the semiconductor layer film 59 and the insulating layer film 55a.

Such a method, i.e., double patterning technology, can form the semiconductor layer 50 and the insulating layer 55 such that a spacing therebetween has a narrow portion and a wide portion. The semiconductor layer pair 53 of the semiconductor layers 50 is arranged at a period of 4F, i.e., the pair pitch L3. The spacing (the distance t1) between the pair of the semiconductor layers 50 forming the semiconductor layer pair 53 is smaller than F (15 nm ignoring the conversion difference of the patterning). The width of the semiconductor layer 50 (the width t3) is 20 nm ignoring the conversion difference of the patterning. The spacing (the distance t2) between adjacent semiconductor layer pairs 53 is larger than F (45 nm ignoring the conversion difference of the patterning).

Although a structure is illustrated where the semiconductor layer film 59 which forms the semiconductor layers 50 and the insulating layer film 55a which forms the insulating layers 55 are alternately stacked in two layers to simplify the above description, the number of stacks of the semiconductor layer 50 and the insulating layer 55 is arbitrary. The gate electrode 70 also may have a structure in which a narrow spacing and a wide spacing are periodically arranged using the double patterning technology recited above as necessary.

Figure 4A:
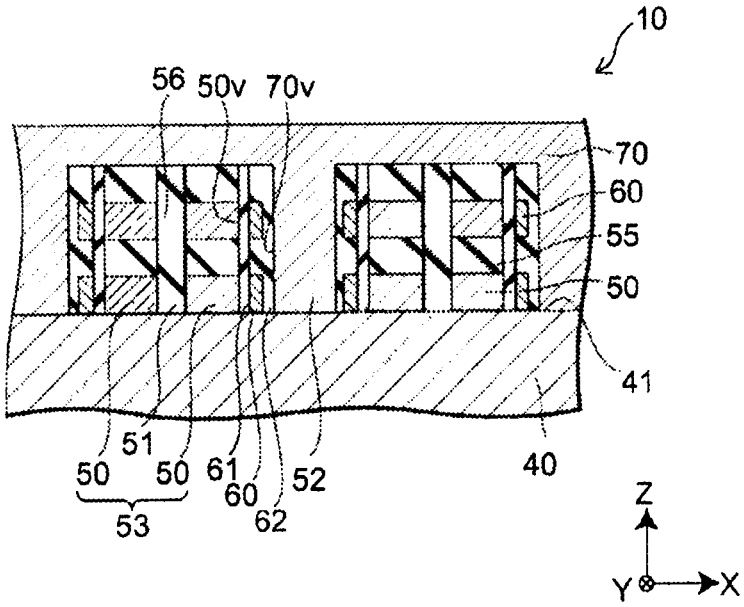
FIGS. 4A and 4B are schematic cross-sectional views illustrating structures of main components of the nonvolatile semiconductor storage device according to the first embodiment of the present invention.
Figure 4B:
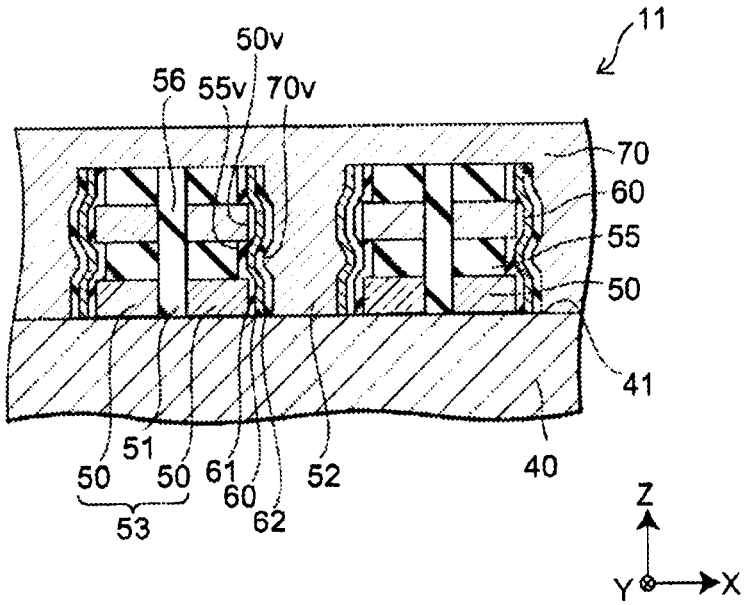

FIGS. 4A and 4B are schematic cross-sectional views illustrating structures of main components of the nonvolatile semiconductor storage device according to the first embodiment of the present invention.

In other words, FIGS. 4A and 4B illustrate two examples of structures of the first insulating film, the charge storage layer, and the second insulating film of the nonvolatile semiconductor storage device according to this embodiment. FIGS. 4A and 4B illustrate enlarged cross sections corresponding to line A-A' of FIG. 1A.

As illustrated in FIG. 4A, the charge storage layers 60 are provided between the faces 50v (the side faces) of the semiconductor layers 50 perpendicular to the major surface 41 on the second spacing 52 side and the face 70v (the side face) of the gate electrode 70 perpendicular to the major surface 41. A first insulating film 61 is provided between the semiconductor layers 50 and the charge storage layers 60. A second insulating film 62 is provided between the charge storage layers 60 and the gate electrode 70. The first insulating film 61 may function as a tunnel insulating film. The second insulating film 62 may function as a block insulating film. An insulating film 56 is provided between the semiconductor layers 50 on the first spacing 51 side.

In the nonvolatile semiconductor storage device 10 illustrated in FIG. 4A, the charge storage layers 60 are provided separately for each face 50v (side face) of the stacked semiconductor layers 50 perpendicular to the major surface 41 on the second spacing 52 side. Thereby, the deterioration of charge retention characteristics due to a lateral diffusion of the charge in the charge storage layer 60, from a cell to which the charge is written, to an unwritten cell or into other films can be inhibited.

In another nonvolatile semiconductor storage device 11 of this embodiment illustrated in FIG. 4B, the charge storage layer 60 is continuously provided along the faces 50v (the side faces) of the stacked semiconductor layers 50 perpendicular to the major surface 41 on the second spacing 52 side and faces 55v (side faces) of the stacked insulating layers 55 perpendicular to the major surface 41 on the second spacing 52 side. The faces 55v (the side faces) of the stacked insulating layers 55 perpendicular to the major surface 41 on the second spacing 52 side are provided recessed toward the first spacing 51 side as viewed from the second spacing 52 than are the faces 50v (the side faces) of the stacked semiconductor layers 50 perpendicular to the major surface 41 on the second spacing 52 side. In other words, the charge storage layer 60 is continuously provided from the side faces of the stacked semiconductor layers 50 to the side faces of the adjacent insulating layers 55; and the side faces of the insulating layers 55 are recessed from the side faces of the semiconductor layers 50.

In other words, the charge storage layer 60 is formed such that the length of the charge storage layer 60 aligning along the side faces of the insulating layers 55 between adjacent semiconductor layers 50 (the length aligning in the direction perpendicular to the major surface 41 of the substrate 40) is longer in comparison with the shortest distance between the memory cells stacked in the direction perpendicular to the major surface 41.

Thereby, the deterioration of charge retention characteristics due to a lateral diffusion of the charge in the charge storage layer 60, from a cell to which the charge is written, to an unwritten cell or into other films can be inhibited.

Thus, the nonvolatile semiconductor storage devices 10 and 11 provide good retention characteristics.

In the nonvolatile semiconductor storage devices 10 and according to this embodiment described above, the bit density can be increased by stacking memory cells in both the direction perpendicular and the direction parallel to the substrate. In other words, the integration can be improved without performing miniaturization.

Further, a transistor of each memory cell has an SOI (Silicon on Insulator) structure including a silicon channel on an insulating film. The gate electrode has a strong controllability over the channel and therefore provides resistance to short channel effects and easily enables multi-level storage. In this embodiment in particular, a UT-SOI (Ultra-Thin Silicon On Insulator) structure is used, and therefore a transistor highly resilient to short channel effects can be realized. Therefore, the dominance over the channel is particularly strong, providing the advantage that multi-level storage such as two bits (that is, four values) per cell or three bits (that is, eight values) per cell can easily be realized. In other words, the memory cell including the charge storage layer 60 can retain multi-bit information.

The semiconductor layer pair 53 is formed at the period of 4F. Thereby, the space necessary to form the stacked films of the MONOS structure is ensured.

Also, the charge storage layer 60 is shielded by the semiconductor layer 50 on the first spacing 51 side and by the gate electrode 70 on the second spacing 52 side. Therefore, an advantage is provided that inter-cell interference causing the threshold voltage shift of the memory cell according to the writing and erasing operations of an adjacent cell can be inhibited.

Moreover, downscaling is easier than by the technology of, for example, JP-A 2007-266143 (Kokai); and the number of stacking layers can be reduced. Different than the technology of JP-A 2007-266143 (Kokai), NAND chains are formed in the direction parallel to the major surface of the substrate 40. Therefore, the structure of the peripheral circuit can be similar to that of conventional NAND flash memory.

Thus, the nonvolatile semiconductor storage device and the method for manufacturing the same according to this embodiment provide a new structure that has few constraints on downscaling, is easy to manufacture, and does not require drastic modifications to the peripheral circuit.

First and second examples according to the first embodiment are described as follows.

First Example

A nonvolatile semiconductor storage device 20 according to a first example of the present invention is a flash memory using two stacked layers of memory cells having a 22 nm half pitch to realize a cell surface area of 968 $nm^2$ corresponding to a nonvolatile semiconductor storage device of a conventional planar cell structure having a 15 nm half pitch.

An insulating layer that separates the substrate 40 and the first semiconductor layer 50 is shared as a gate insulation film of a peripheral high-voltage circuit. Restated, the gate insulation film of a transistor of the peripheral high-voltage circuit includes a layer which forms an insulating layer between the substrate 40 and the semiconductor layer 50 most proximal to the substrate 40. Then, polycrystalline silicon is used as the silicon channel of the semiconductor layer 50. The charge storage layer 60 is formed in the structure illustrated in FIG. 3A. In other words, the charge storage layer 60 is provided separately for each face 50v of the stacked semiconductor layers 50 perpendicular to the major surface 41 on the second spacing 52 side. The description assumes the case where the semiconductor layer 50 is a bit line and the gate electrode 70 is a word line.

A method for manufacturing the nonvolatile semiconductor storage device 20 according to this example will now be described.

Figure 5A:
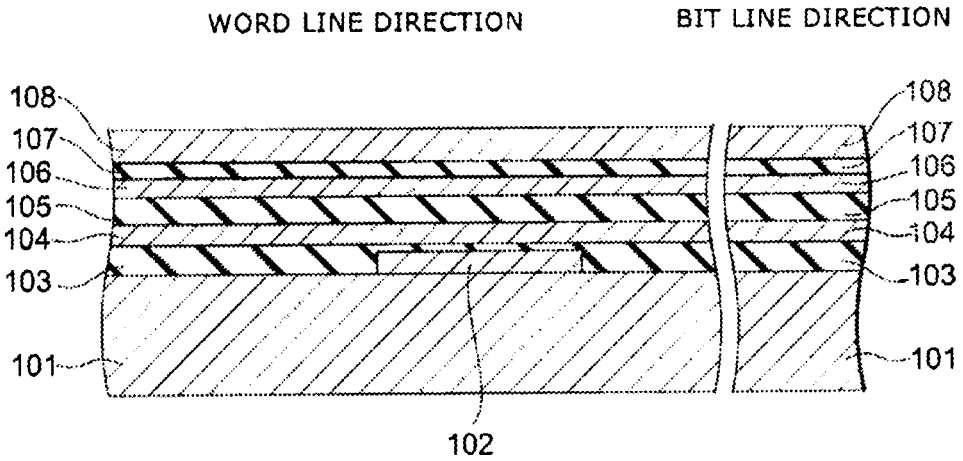
FIGS. 5A and 5B are schematic cross-sectional views illustrating a method for manufacturing a nonvolatile semiconductor storage device according to a first example of the first embodiment of the present invention.
Figure 5B:
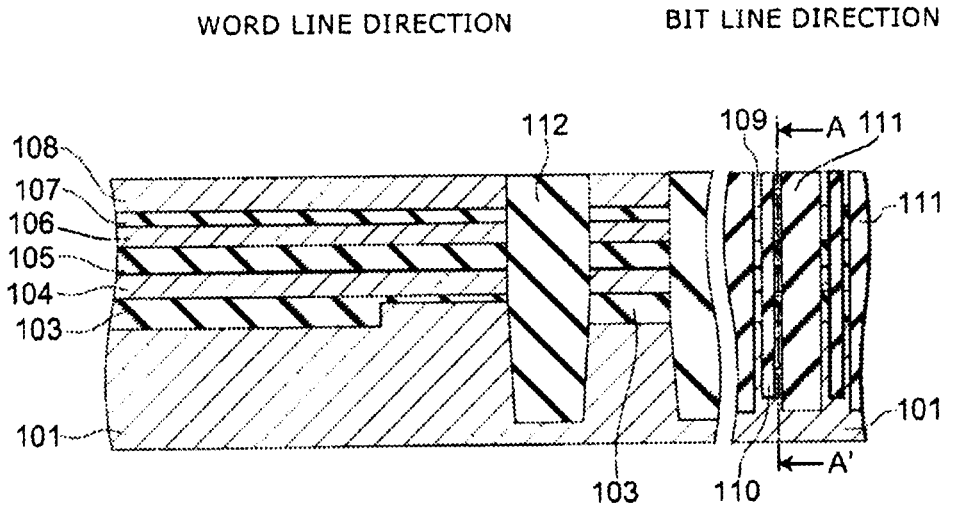

FIGS. 5A and 5B are schematic cross-sectional views illustrating the method for manufacturing the nonvolatile semiconductor storage device according to the first example of the first embodiment of the present invention.

FIG. 5A is a view of the first step. FIG. 5B is a view continuing from FIG. 5A.

Figure 6A:
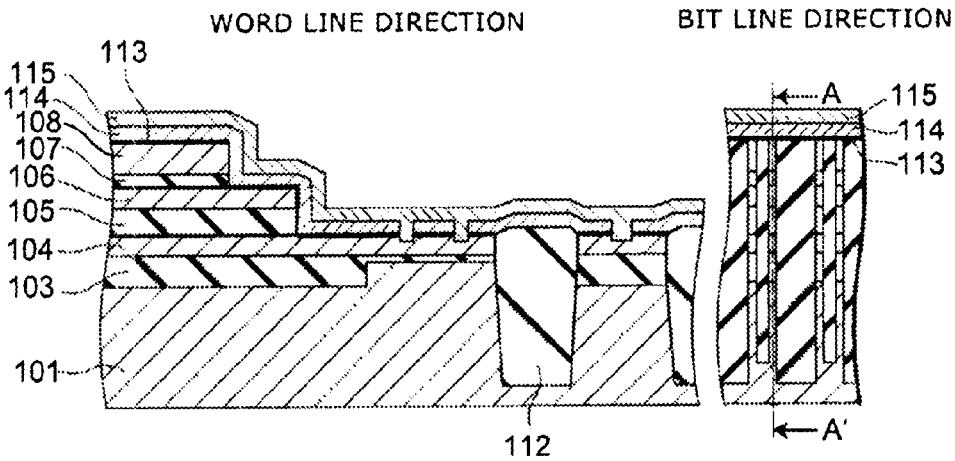
FIGS. 6A and 6B are schematic cross-sectional views illustrating a method for manufacturing a nonvolatile semiconductor storage device according to the first example.
Figure 6B:
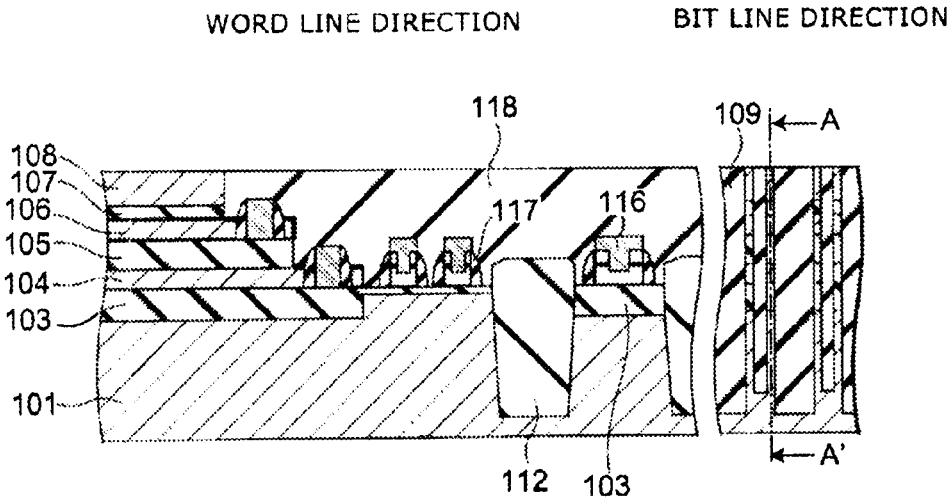
Figure 7A:
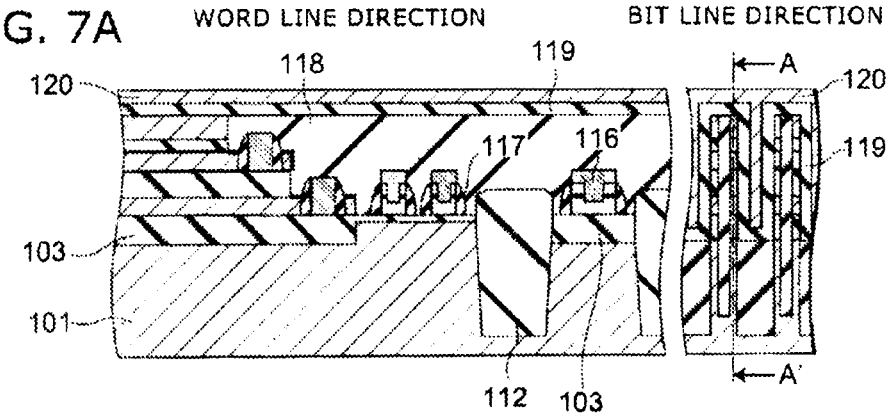
FIGS. 7A to 7C are views schematic cross-sectional views illustrating a method for manufacturing a nonvolatile semiconductor storage device according to the first example.
Figure 7B:
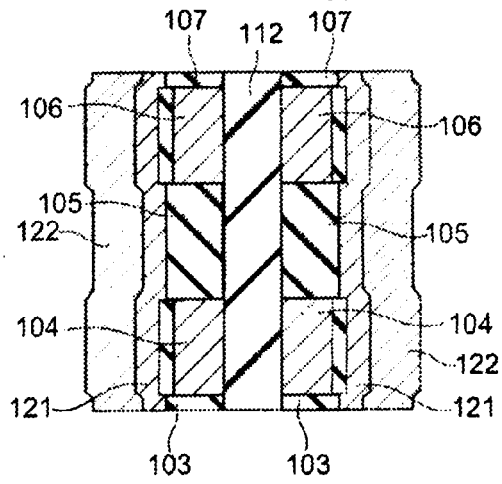
Figure 7C:
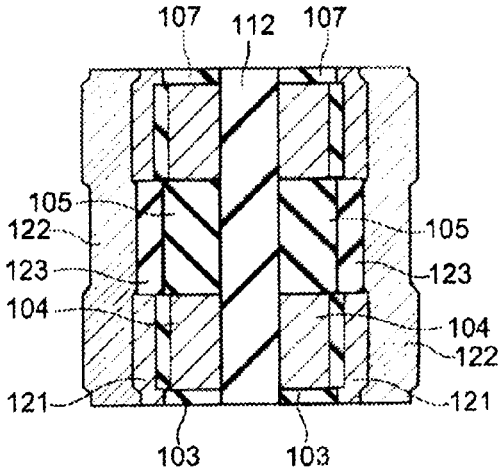
Figure 8A:
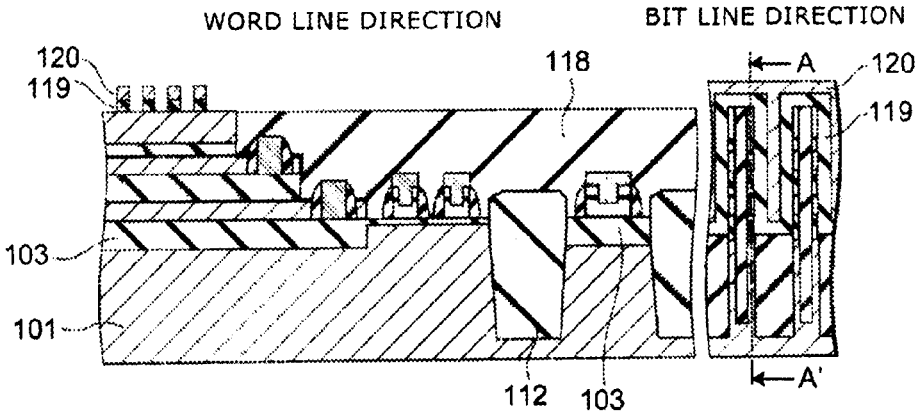
FIGS. 8A and 8B are views schematic cross-sectional views illustrating a method for manufacturing a nonvolatile semiconductor storage device according to the first example.
Figure 8B:
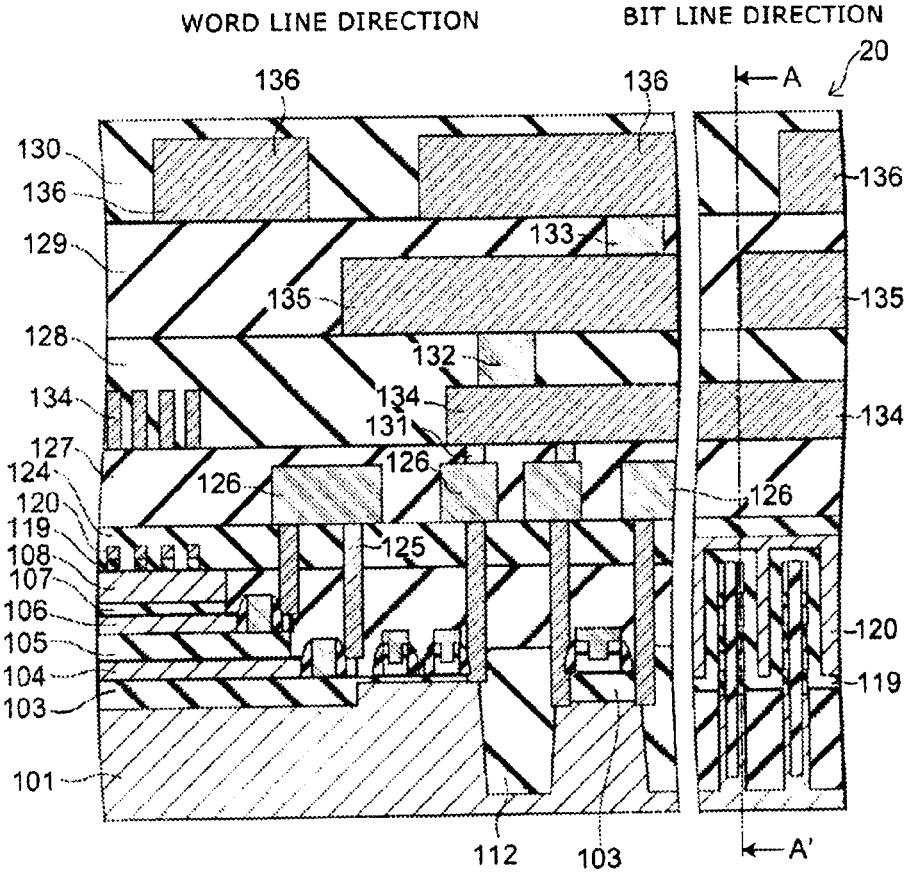

FIGS. 6A and 6B are views continuing from FIG. 5B. FIGS. 7A to 7C are views continuing from FIG. 6B. FIGS. 8A and 8B are views continuing from FIG. 7C.

In FIGS. 5A to 7A and FIGS. 8A and 8B, each view on the left side is a cross-sectional view in the word line (the gate electrode) direction, that is, a cross-sectional view cut along a plane perpendicular to the extension direction of the word line. Each view on the right is a cross-sectional view in the bit line (the semiconductor layer) direction, that is, a view cut along a plane perpendicular to the extension direction of the bit line. FIGS. 7B and 7C are enlarged cross-sectional views of main components in the bit line direction. Each view on the left side of FIGS. 5B to 7A and FIGS. 8A and 8B is a cross-sectional view along line A-A' of the view on the right side.

As illustrated in FIG. 5A, first, a cell portion and a peripheral high-voltage circuit portion on a semiconductor substrate 101 are recessed a distance of 30 nm by lithography and reactive ion etching. This step resolves the difference in levels resulting from the gate oxide film thicknesses of the high-voltage circuit portion and a low-voltage circuit portion, and is a step performed for normal flash memory as well.

Continuing, a silicon thermal oxide film, which forms a gate oxide film of the high-voltage circuit portion and an inter-layer dielectric film of the cell, is formed with a thickness of 35 nm. A gate oxide film 102 which forms peripheral low-voltage circuit portion transistors is then formed with a thickness of 8 nm. Thereby, the silicon thermal oxide film 103 which forms the gate oxide layer of the high-voltage circuit portion and the inter-layer dielectric film of the cells has a film thickness of 40 nm.

Then, an n-type polycrystalline silicon film 104 which forms a portion of the gate electrode of the peripheral circuit and a first semiconductor layer is formed with a thickness of 30 nm. A silicon oxide film 105 which forms an insulating layer between the first and second semiconductor layers is formed with a thickness of 40 nm. An n-type polycrystalline silicon film 106 which forms a second semiconductor layer is formed with a thickness of 30 nm. A silicon oxide film 107 is formed with a thickness of 20 nm. A silicon nitride film 108 which forms a CMP (Chemical Mechanical Polishing) stopper is formed with a thickness of 50 nm.

Continuing as illustrated in FIG. 5B, the semiconductor layers are patterned by lithography and reactive ion etching.

Here, during the lithography of the cell portion, a semiconductor layer pair 109 is repeatedly formed at a period of 4F=88 nm using side-wall transfer technology.

The width of each of the semiconductor layers is 15 nm. The width of a gap 110 (the first spacing 51) between adjacent semiconductor layers is 15 nm. The width of a gap 111 (the second spacing 52) between semiconductor layer pairs is 43 nm. The collective patterning of the memory cells (also referred to as "cells") also makes an isolation trench which forms STI (Shallow Trench Isolation) of the peripheral circuit portion.

Continuing, the isolation trench of the peripheral circuit portion, the gap 110 between the semiconductor layers, and the gap 111 between the semiconductor layer pairs are filled by an insulating film 112 formed by a TEOS (tetraethoxysilane)/$O_3$ film or an SOG (Spin On Glass) film, etc.

Then, the insulating film 112 is flattened by CMP.

As illustrated in FIG. 6A, the silicon nitride film 108, the silicon oxide film 107, the n-type polycrystalline silicon film 106, and the silicon oxide film 105 of the peripheral circuit portion and a select gate portion of the first semiconductor layer are then removed by lithography and reactive ion etching. The silicon nitride film 108 and the silicon oxide film 107 of the select gate portion of the second layer are removed by lithography and reactive ion etching.

Continuing, a silicon oxide film 113 which forms the gate oxide film of the select gate and an n-type polycrystalline silicon film 114 which forms the gate electrode of the select gate are formed.

Through-holes are then made through the n-type polycrystalline silicon film 114 and the silicon oxide film 113 of the peripheral circuit portion to the n-type polycrystalline silicon film 104 by lithography and reactive ion etching. An n-type polycrystalline silicon film 115 is then formed.

Thereby, a structure can be formed in which the n-type polycrystalline silicon film 115 and the n-type polycrystalline silicon film 104 are connected in the peripheral circuit portion.

Continuing as illustrated in FIG. 6B, known transistor formation technology is used to pattern the n-type polycrystalline silicon film 115, the silicon oxide film 113, and the n-type polycrystalline silicon film 104 of the select gates and the peripheral circuit portion to form gate electrodes 116 of the peripheral circuit, and to form a side wall oxide film 117 and a diffusion layer (not illustrated). An inter-layer dielectric film 118 is filled and flattened.

Then, as illustrated in FIG. 7A, the insulating film 112 in the gap 111 between the adjacent semiconductor layer pairs is etched back by lithography and reactive ion etching.

Side walls of the n-type polycrystalline silicon films 104 and 106 are then cleaned by HF/$NH_3$ gas. MONOS cells are formed by a stacked insulating film 119, which includes a silicon thermal oxidation film (having a thickness of 4 nm), a charge storage layer (having a thickness of 5 nm), and a charge block film (having a thickness of 11 nm). Thus, the width of the n-type polycrystalline silicon film which forms the semiconductor layer is 13 nm; and the gap between charge block films is 7 nm. The charge storage layer includes, for example, a silicon nitride film. The charge block film includes, for example, an alumina film.

Continuing, a CVD-deposited WSi film 120 which forms the gate electrode is formed on the entire substrate surface.

The CVD-deposited WSi film 120 is then patterned by lithography and reactive ion etching to form the gate electrodes of the cells.

At this time, the stacked insulating film 119 is collectively patterned to separately provide the charge storage layers in each of the stacked cells. Restated, the silicon nitride film, i.e., the charge storage layer in the stacked insulating film 119, is oxidized via the insulating film 112, the silicon thermal oxide film 103, the silicon oxide film 105, and the silicon oxide film 107 by a high-temperature rapid thermal oxidation using radicals from a hydrogen/oxygen gas mixture. The charge storage layers are thereby provided separately for the stacked cells.

In other words, prior to the oxidation as illustrated in FIG. 7B, the charge storage layer 121 and the charge block film 122 exist continuously on the side walls of the silicon thermal oxidation film 103, the silicon oxide film 105, and the silicon oxide film 107.

However, as illustrated in FIG. 7C, only the charge storage layer 121 is selectively oxidized by radical oxidation. A silicon thermal oxynitride film 123 is formed, and the charge storage layers 121 can be provided separately for each stacked cell.

Thus, as illustrated in FIG. 8A, a stacked UT-SOI MONOS cell is formed.

Then, an inter-layer dielectric film 124 is formed on the entire substrate surface. Contact plugs 125 are formed to draw out from the peripheral circuit and the stacked semiconductor layers. The elements are connected by leads 126.

Hereafter, a circuit of the flash memory is formed by multilevel interconnection; but a description thereof is omitted.

Thereby, the nonvolatile semiconductor storage device 20 according to this example illustrated in FIG. 8B is manufactured.

In FIG. 8B, inter-layer dielectric films 127, 128, 129, and 130 are stacked, and leads 134, 135, and 136 are connected by contact plugs 131, 132, and 133.

In the structure of the nonvolatile semiconductor storage device 20 of this example, the transistor of each cell has a UTSOI structure that is resistant to short channel effects and has a strong dominance over the channel. Therefore, an advantage is provided that multi-level storage such as two bits (that is, four values) per cell or three bits (that is, eight values) per cell can easily be realized. Additionally, the charge storage layers of the semiconductor layers forming the pair are shielded by the semiconductor layers themselves, and the charge storage layers of adjacent semiconductor layer pairs are shielded by the control gate electrodes. Therefore, an advantage is provided that inter-cell interference causing the threshold of the cell to vary according to the writing and erasing operations of an adjacent cell can be inhibited.

Moreover, the nonvolatile semiconductor storage device 20 of this example can achieve a storage density twice that of a normal single-layer memory. Although the semiconductor layers are stacked on the substrate in the nonvolatile semiconductor storage device 20, the patterning of the semiconductor layers (the bit lines) and the gate electrodes (the word lines) can be performed by the same patterning as a normal non-stacked memory, that is, by one lithography step each.

Thus, the nonvolatile semiconductor storage device 20 of this example enables improvement of the integration of cells without miniaturization; and even an advantage is provided that leading-edge lithography steps such as EUV (Extreme Ultraviolet), ArF immersion, and the like are not necessary.

The projected surface area of the cell of the nonvolatile semiconductor storage device 20 of this example is 1,936 $nm^2$, and is, for example, about 26% of the surface area in comparison to a cell manufactured by the technology of JP-A 2007-266143 (Kokai).

Further, while the two-layer stacked structure provides an effective cell surface area of 1936/2=968 $nm^2$, it is necessary to use an eight-layer stacked structure to realize the same effective cell surface area by the technology of JP-A 2007-266143 (Kokai), resulting in four times the number of stacking layers than that of the nonvolatile semiconductor storage device of this example.

Generally, the yield of a stacked structure is the product of the yield of each layer. Therefore, it is clear that the nonvolatile semiconductor storage device 20 of this example may achieve a higher yield in comparison to that of conventional art.

Although a polycrystalline silicon film and a silicon oxide film are stacked and collectively patterned in the nonvolatile semiconductor storage device 20 of this example, this configuration can be replaced by stacking and collectively patterning an epitaxial silicon film and a silicon oxide film.

Methods for forming the epitaxial silicon film may include a method that uses a portion of the substrate as a seed and forms an epitaxial silicon film at a high temperature. Also, a method may be used that forms an amorphous silicon film and then implements lateral epitaxial growth using a portion of the substrate as a seed. Formation is also possible by forming a stacked film of an epitaxial silicon-germanium film/epitaxial silicon film, selectively etching the epitaxial silicon-germanium film, and performing thermal oxidation of the openings thereof.

Second Example

A nonvolatile semiconductor storage device 21 according to a second example of the present invention is a five-layer stacked memory corresponding to a 10-nm generation half pitch. The nonvolatile semiconductor storage device 21 is an example in which each monocrystalline silicon film forming the semiconductor layers 50 is formed by a stacked film of a monocrystalline silicon film/oxide film formed by sequentially growing stacks of epitaxial silicon and epitaxial silicon-germanium, removing the silicon-germanium film by selective etching, and performing thermal oxidation of the resulting openings.

Although the charge storage layer of the first example is separated by reactive ion etching during the patterning of the gate electrode and thermal oxidation of the charge storage layer, the movement of charge is inhibited in this example by making the length of the charge storage layer 60 between cells in the stacking direction longer than the distance between the stacked cells by forming the insulating films between the stacked semiconductor layers 50 in a three-layer structure. Restated, the nonvolatile semiconductor storage device 21 of this example has the structure schematically illustrated in FIG. 4B.

A method for manufacturing the nonvolatile semiconductor storage device 21 according to this example will now be described.

The method for forming the peripheral circuit and the select gate portion is basically the same even as the number of stacking layers of the semiconductor layers 50 stacked in the direction perpendicular to the major surface 41 of the substrate 40 increases. Therefore, to avoid complexity, only the cell portion is described below. The description assumes that the semiconductor layer 50 is a bit line and the gate electrode 70 is a word line.

Figure 9A:
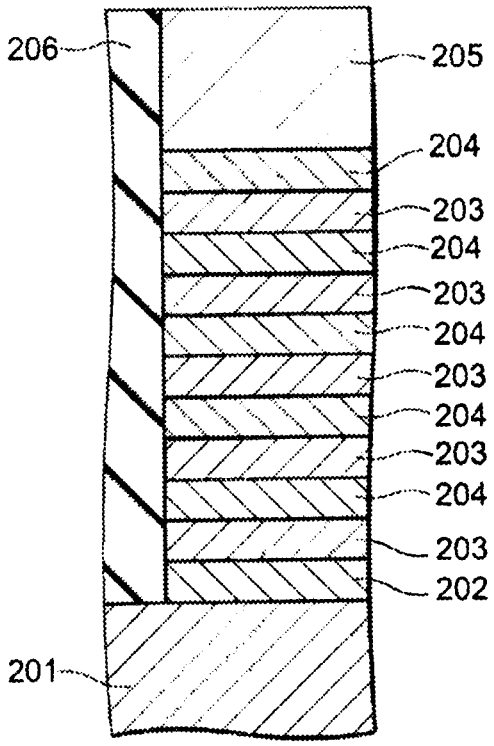
FIGS. 9A and 9B are schematic cross-sectional views illustrating a method for manufacturing a nonvolatile semiconductor storage device according to a second example of the first embodiment of the present invention.
Figure 9B:
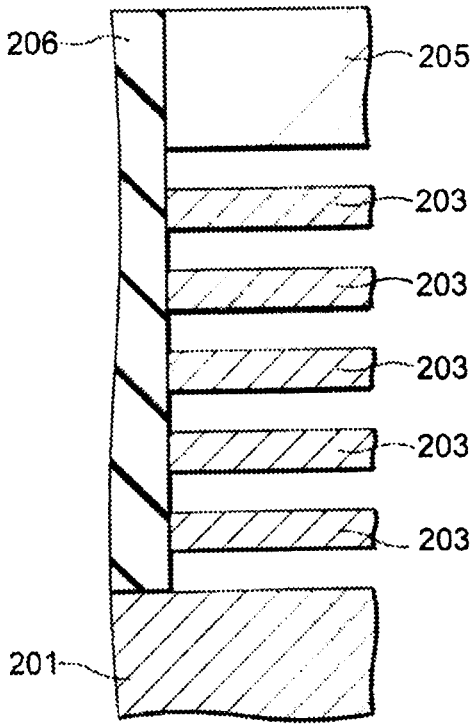

FIGS. 9A and 9B are schematic cross-sectional views illustrating the method for manufacturing the nonvolatile semiconductor storage device according to the second example of the first embodiment of the present invention.

FIG. 9A is a view of the first step. FIG. 9B is a view continuing from FIG. 9A.

Figure 10A:
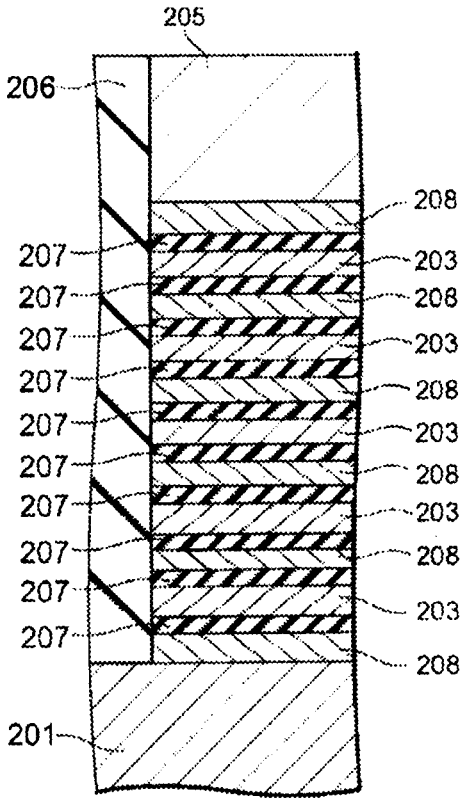
FIGS. 10A and 10B are schematic cross-sectional views illustrating a method for manufacturing a nonvolatile semiconductor storage device according to the second example.
Figure 10B:
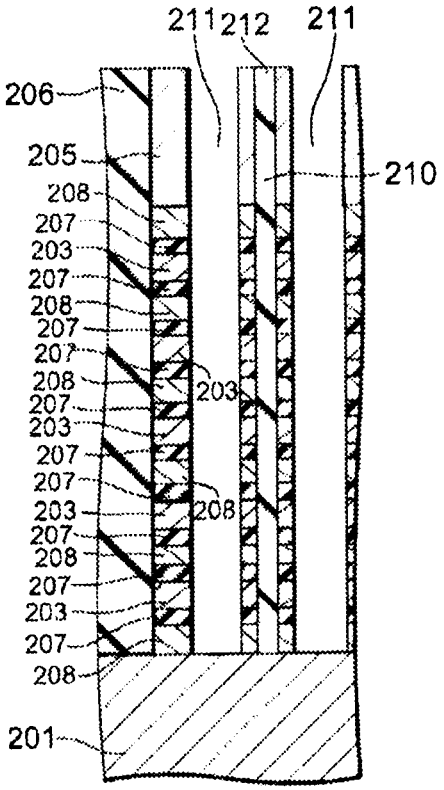
Figure 11A:
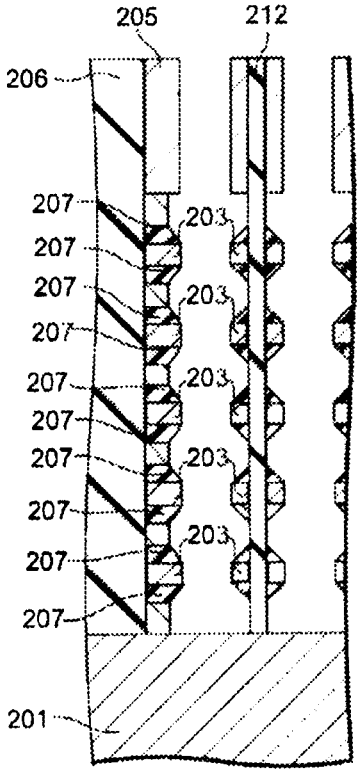
FIGS. 11A and 11B are schematic cross-sectional views illustrating a method for manufacturing a nonvolatile semiconductor storage device according to the second example.
Figure 11B:
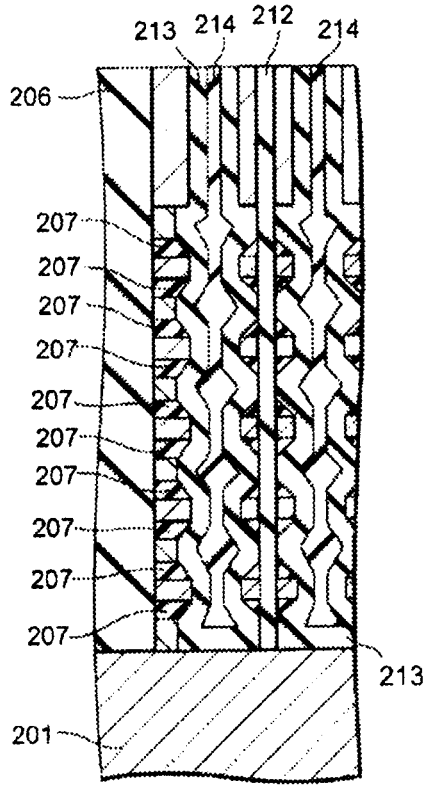

FIGS. 10A and 10B are views continuing from FIG. 9B. FIGS. 11A and 11B are views continuing from FIG. 10B.

These views are cross-sectional views in the bit line (the semiconductor layer) direction, that is, views cut along planes perpendicular to the extension direction of the bit line.

First, as illustrated in FIG. 9A, an epitaxial silicon-germanium film 202 is formed with a thickness of 30 nm on the cell portion of a semiconductor substrate 201. An epitaxial silicon film 203 with a thickness of 40 nm and an epitaxial silicon-germanium film 204 with a thickness of 30 nm are then formed in ten alternately stacked layers.

Then, a silicon nitride film 205 is formed with a thickness of 100 nm. Lithography and reactive ion etching are used to collectively pattern the silicon nitride film and the multi-layer epitaxial film of the cell region. A CVD silicon oxide film 206 which forms a support of each layer is then formed on the end face of the exposed multi-layer epitaxial film with a thickness of 200 nm.

Continuing as illustrated in FIG. 9B, a slit-shaped through-hole (not illustrated) is made by collectively patterning the silicon nitride film and the multi-layer epitaxial film. The epitaxial silicon-germanium films are removed by selective wet etching from the through-hole.

Then, as illustrated in FIG. 10A, the epitaxial silicon films 203 are oxidized by thermal oxidation to form silicon thermal oxidation films 207 with a thickness of 10 nm. SOG is applied over the entire substrate surface, and an SOG film 208 is filled into the openings between the silicon thermal oxidation films 207.

As illustrated in FIG. 10B, the semiconductor layers are then patterned by lithography and reactive ion etching similarly to the first example.

Here, semiconductor layer pairs 209 are repeatedly formed at a period of 4F=88 nm by lithography of the cell portion using side-wall transfer technology. The width of each semiconductor layer in the direction parallel to the substrate is 15 nm. The gap 210 (the first spacing 51) between the semiconductor layers is 15 nm. The gap 211 (the second spacing 52) between adjacent semiconductor layer pairs is 43 nm. An isolation trench (not illustrated) which forms an STI of the peripheral circuit portion also is formed by the collective patterning of the cells.

Continuing, an insulating film 212 formed by a TEOS/$O_3$ film or an SOG film, etc., is filled into the gap 210 between the semiconductor layers and the gap 211 between the semiconductor layer pairs. The insulating film 212 is then flattened by CMP. The insulating film 212 of the gap 211 between adjacent semiconductor layer pairs is then removed by lithography and reactive ion etching.

As illustrated in FIG. 11A, HF wet etching is then used to clean the side walls of the epitaxial silicon film 203 and etch the SOG film 208 into a recessed configuration. At this time, the silicon thermal oxidation film 207 is finer and has a lower wet etching speed in comparison to the SOG film 208. Therefore, the insulating films on the (second spacing 52) side between the stacked semiconductor layer pairs have a tapered configuration as illustrated in FIG. 11A.

Continuing as illustrated in FIG. 11B, MONOS cells are formed by a stacked insulating film 213, which includes a silicon thermal oxidation film (having a thickness of 4 nm), a charge storage layer (having a thickness of 5 nm), and a charge block film (having a thickness of 11 nm). Thus, the width of the n-type polycrystalline silicon film which forms the semiconductor layer is 13 nm; and the gap between charge block films is 7 nm. A CVD-deposited TiN film 214 which forms the gate electrode is then formed over the entire substrate surface.

Then, the CVD-deposited TiN film 214 is patterning to form gate electrodes of the cells by lithography and reactive ion etching. Simultaneously, the stacked insulating film 213 is collectively patterned to separately provide the charge storage layers for adjacent cells.

Thus, stacked MONOS cells are formed.

Hereafter, an inter-layer insulating film is formed to fill between the gate electrodes, and multiple layer leads are formed; but a description thereof is omitted.

In the structure of the nonvolatile semiconductor storage device 21 according to this example as well, the transistor of each cell has a UTSOI structure that is resistant to short channel effects and has a strong controllability over the channel. Therefore, an advantage is provided that multi-level storage such as two bits per cell or three bits per cell can easily be realized.

The nonvolatile semiconductor storage device 21 according to this example differs from the first example in that the charge storage layers are not provided separately for each of the stacked semiconductor layers; but the length of the charge storage layer in the stacking direction is longer than the distance between the stacked semiconductor layers. The movement of charge between adjacent cells is thereby inhibited. Therefore, an advantage is provided similarly to the first example that the retention characteristics of the stored charge are excellent.

While the five stacked layers of the nonvolatile semiconductor storage device 21 according to this example provide an effective cell surface area of 1936/5=387 $nm^2$, it is necessary to use nineteen stacked layers to realize a similar effective cell surface area by the technology of, for example, JP-A 2007-266143 (Kokai).

The yield of a stacked structure is the product of the yield of each layer. Therefore, it is clear that the nonvolatile semiconductor storage device 21 according to this example may achieve a high yield in comparison to that of conventional art.

In each of the examples recited above, the method for forming the silicon film which forms the semiconductor layer, the MONOS film structure, the method for processing the MONOS film structure, and the like are not limited to combinations of the structures and the methods described in the first and second examples. Any combination is possible as long as the purport of the present invention is not forfeited.

Further, a polycrystalline silicon film and a monocrystalline silicon film crystallized by laser annealing or a Ni catalyst method, for example, may be used as the channel silicon.

In addition to $Al_2O_3$, a metal oxide film such as $HfO_2$, $La_2O_3$, $Pr_2O_3$, $Y_2O_3$, $ZrO_2$, and the like, and films of multiple combinations thereof can be used as the charge block film (the second insulating film) in the MONOS structure.

In addition to those described in the first and second examples, at least one selected from the group consisting of TaN, W, WSi, TiN, CoSi, NiSi, NiPtSi, PtSi, Pt, Ru, and $RuO_2$ may be used as the electrode film (a conductive film of at least a portion of the protruding portion 78 of the gate electrode 70 facing the charge storage layer 60) in the MONOS structure.

Figure 12:
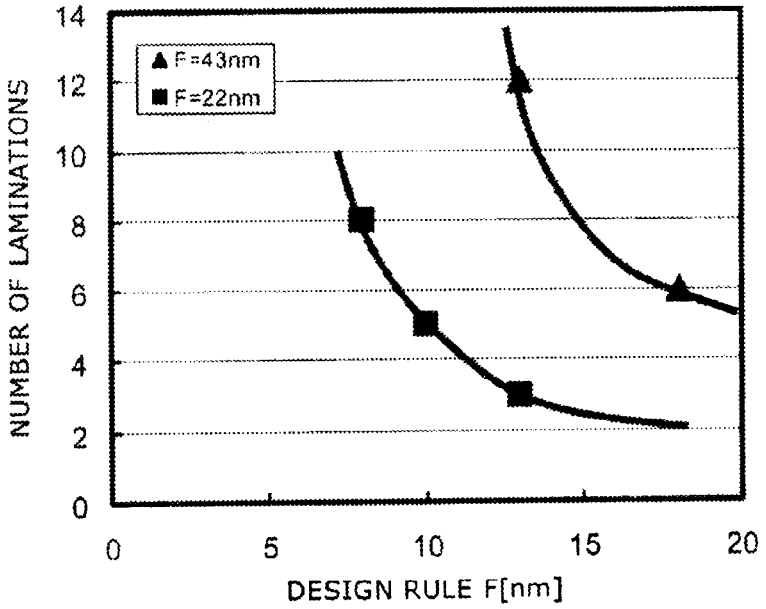
FIG. 12 is a graph illustrating characteristics of a nonvolatile semiconductor storage device according to an embodiment of the present invention.

FIG. 12 is a graph illustrating characteristics of a nonvolatile semiconductor storage device according to an embodiment of the present invention.

FIG. 12 illustrates a miniaturization roadmap to the half pitch F=6 nm generation.

In other words, FIG. 12 illustrates the number of stacked layers for the nonvolatile semiconductor storage device of this embodiment to realize the cell surface area of memory cells of conventional art as the half pitch of a flash memory of conventional art changes. Results for the nonvolatile semiconductor storage device of this embodiment with half pitch F of 22 nm and 43 nm are illustrated. The horizontal axis of FIG. 12 represents the half pitch F, and the vertical axis represents the number of stacked layers.

The limitation of downscaling of the nonvolatile semiconductor storage device according to this embodiment is considered to be a half pitch of about 22 nm for the semiconductor layer 50 in the direction parallel to the major surface 41 of the substrate 40, basically due to constraints of the film thickness of the MONOS film.

Focusing on the case of FIG. 12 where the half pitch F is 22 nm, it is clear that a nonvolatile semiconductor storage device according to this embodiment having not more than ten stacked layers realizes an effective cell surface area corresponding to a conventional single-layer NAND flash memory of the 8-nm generation.

Second Embodiment

A method for manufacturing a nonvolatile semiconductor storage device according to a second embodiment of the present invention is a method for manufacturing a device including the semiconductor layer 50, the gate electrode 70 provided to face the semiconductor layer 50, the charge storage layer 60 provided between the semiconductor layer 50 and the gate electrode 70, the first insulating film 61 provided between the semiconductor layer 50 and the charge storage layer 60, and the second insulating film 62 provided between the charge storage layer 60 and the gate electrode 70. The method for forming the semiconductor layer 50, the gate electrode 70, and the charge storage layer 60 recited above is distinctive and therefore described in detail.

Figure 13:
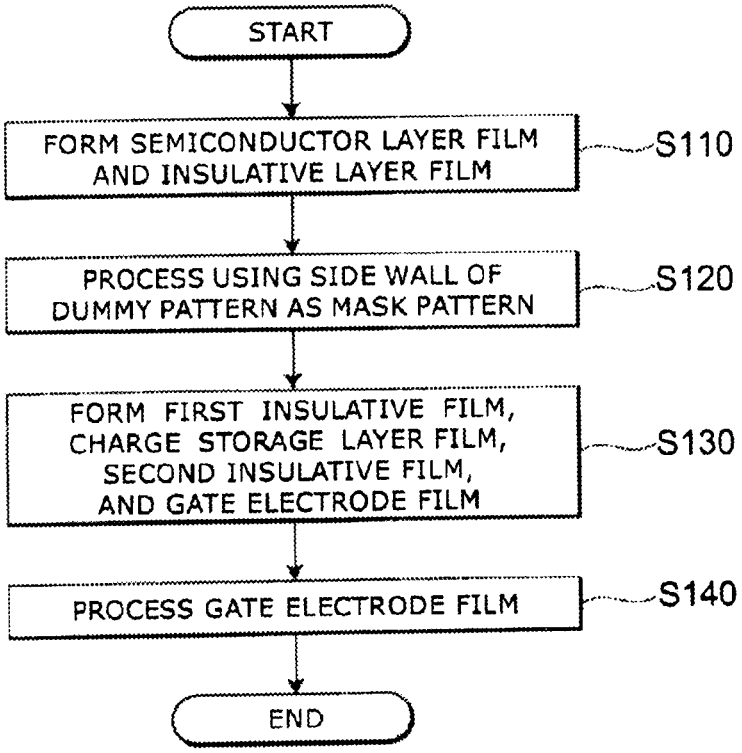
FIG. 13 is a flowchart illustrating a method for manufacturing a nonvolatile semiconductor storage device according to a second embodiment of the present invention.

FIG. 13 is a flowchart illustrating the method for manufacturing the nonvolatile semiconductor storage device according to the second embodiment of the present invention.

In the method for manufacturing the nonvolatile semiconductor storage device according to this embodiment as illustrated in FIG. 13, first, the semiconductor layer film 59 which forms the semiconductor layers 50 and the insulating layer film 55a which forms the insulating layers 55 are formed by stacking on the major surface 41 of the substrate 40 (step S110). The semiconductor layer film 59 may include, for example, the n-type polycrystalline silicon film or the epitaxial silicon film described in the first and second examples. The insulating layer film 55a may include, for example, the silicon oxide film or the stacked film of the silicon thermal oxidation film and the SOG film described in the first and second examples.

The semiconductor layer film 59 and the insulating layer film 55a are patterned (processed) to alternately provide a first spacing 51 and a second spacing 52 larger than the first spacing 51 between stacked units including the semiconductor layers 50 and the insulating layers 55 by using a mask pattern formed by a side wall formed on a side face of a dummy pattern formed parallel to the major surface 41 of the substrate 40 at a period four times the size of the half pitch F of the device to align in a first direction (step S120). The method described in FIGS. 3A to 3E may be used for this step.

A film which forms the first insulating film 61, a charge storage layer film which forms the charge storage layer 60, and a film which forms the second insulating film 62 are formed on a side face of the stacked unit including the semiconductor layers 50 and the insulating layers 55 on the second spacing 52 side; and a gate electrode film which forms the gate electrode 70 is formed on the film which forms the second insulating film and on a major surface of the stacked unit (step S130). The various materials described in the first and second embodiments may be used in this step.

The gate electrode film is patterned (processed) into a band configuration parallel to the major surface 41 of the substrate 40 to align in the second direction (for example, the Y-axis direction) non-parallel to the first direction (step S140).

Thereby, a method for manufacturing a nonvolatile semiconductor storage device having a new configuration can be provided with few constraints on miniaturization, is easy to manufacture, and does not require drastic modifications to the peripheral circuit.

A step that fills an insulating film into the gap on the first spacing 51 side of the patterned (processed) and formed semiconductor layers 50 and the insulating layers 55 may be provided between the step S120 and the step S130 recited above.

Third Embodiment

Figure 14:
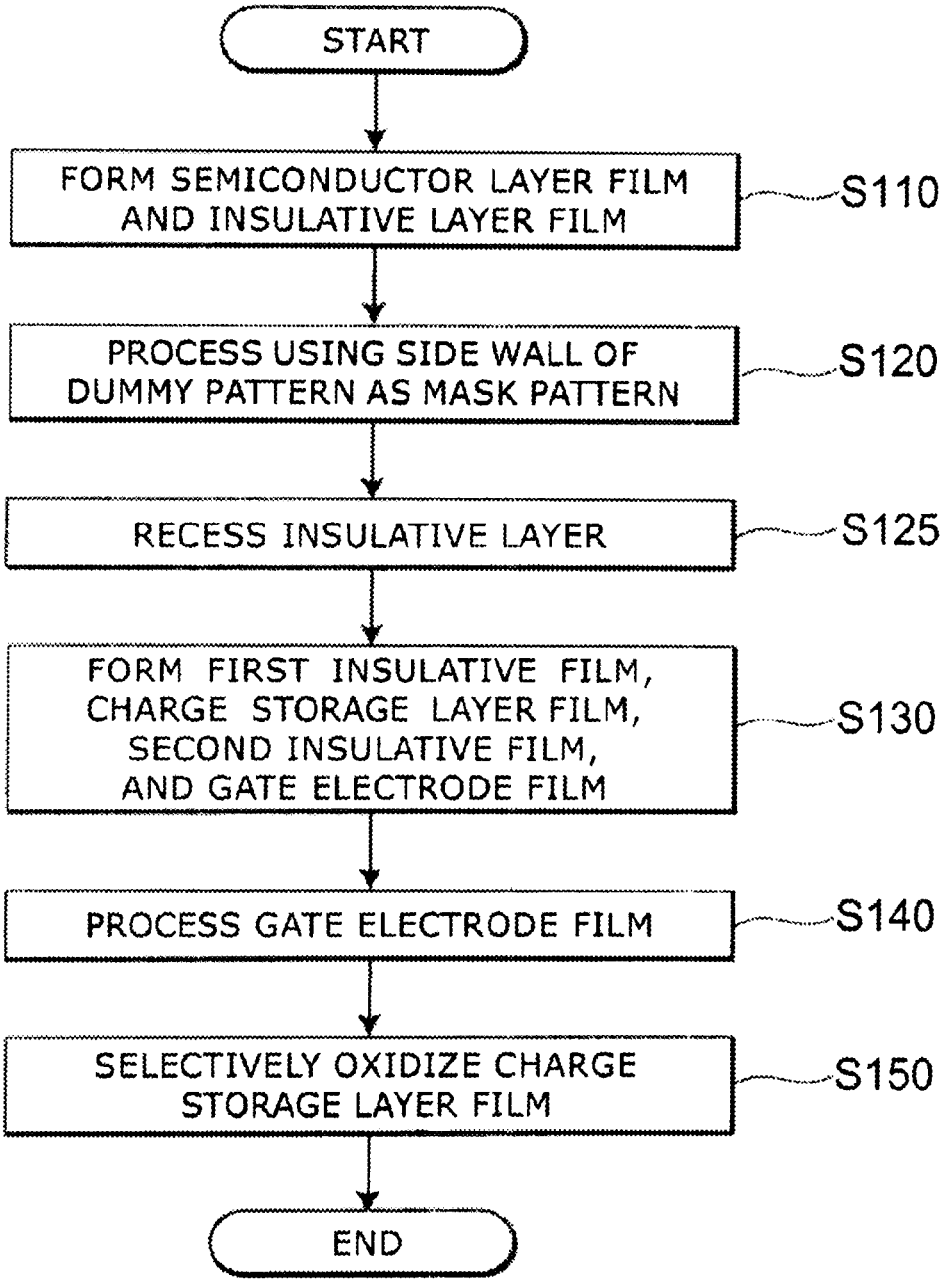
FIG. 14 is a flowchart illustrating a method for manufacturing a nonvolatile semiconductor storage device according to a third embodiment of the present invention.

FIG. 14 is a flowchart illustrating a method for manufacturing a nonvolatile semiconductor storage device according to a third embodiment of the present invention.

In the method for manufacturing the nonvolatile semiconductor storage device according to the third embodiment of the present invention illustrated in FIG. 14, after step S140 described above in FIG. 13, the charge storage layer film is provided separately for each side face (the face 50v perpendicular to the major surface 41) of the stacked semiconductor layers 50 on the second spacing 52 side (step S150). Alternatively, a side face (the face 55v perpendicular to the major surface 41) of the insulating layer 55 on the second spacing 52 side is recessed (recessed toward the first spacing 51 side as viewed from the second spacing 52) from side faces (the faces 50v perpendicular to the major surface 41) of the adjacent stacked semiconductor layers 50 on the second spacing 52 side prior to the step S130 (step S125). It is sufficient that either step S125 or step S150 recited above is implemented.

In other words, the charge storage layer 60 is provided separately for each stacked memory cell after the step forming the gate electrode 70; or the insulating layer 55 between the semiconductor layers 50 is recessed to make the length of the charge storage layer aligning along the side faces of the insulating layers 55 in the stacking direction larger than the distance between the stacked memory cells.

The methods described in the first example or the second example can be used for these steps. For example, the step that separately provides the charge storage layer film 69 for each side face (each face 50v perpendicular to the major surface 41 on the second spacing 52 side) of the stacked semiconductor layers 50 may include the method of selectively oxidizing the charge storage layer film 69 by oxidizing via the stacked insulating layers 55 as described in the first example.

Thereby, the charge storage layer 60 can be essentially divided for each memory cell; and the deterioration of charge retention characteristics due to lateral diffusion of the charge in the charge storage layer 60, from a cell to which the charge is written, to an unwritten cell or into other films can be inhibited.

It is clear that the embodiments of the present invention described above are applicable to a stacked memory having more stacked layers than the examples recited above. Use of embodiments of the present invention will hereafter enable further continuous improvement of integration. Therefore, various fields of application are expected to expand.

Hereinabove, embodiments of the present invention are described with reference to specific examples. However, the present invention is not limited to these specific examples. For example, one skilled in the art may appropriately select specific configurations of components of the nonvolatile semiconductor storage device and the method for manufacturing the same from known art and similarly practice the present invention. Such practice is included in the scope of the present invention to the extent that similar effects thereto are obtained.

Further, any two or more components of the specific examples may be combined within the extent of technical feasibility; and are included in the scope of the present invention to the extent that the purport of the present invention is included.

Moreover, all nonvolatile semiconductor storage devices and methods for manufacturing the same that can be obtained by an appropriate design modification by one skilled in the art based on the nonvolatile semiconductor storage devices and the methods for manufacturing the same described above as embodiments of the present invention also are within the scope of the present invention to the extent that the purport of the present invention is included.

Furthermore, various modifications and alterations within the spirit of the present invention will be readily apparent to those skilled in the art. All such modifications and alterations should therefore be seen as within the scope of the present invention.

The invention claimed is:

1. A method for manufacturing a nonvolatile semiconductor storage device, the device including: a semiconductor layer; a gate electrode provided facing the semiconductor layer; a charge storage layer provided between the semiconductor layer and the gate electrode; a first insulating film provided between the semiconductor layer and the charge storage layer; and a second insulating film provided between the charge storage layer and the gate electrode, the method comprising:

stacking to form a semiconductor layer film and an insulating layer film on a major surface of a substrate, the semiconductor layer film forming the semiconductor layer, the insulating layer film forming an insulating layer;

processing the semiconductor layer film and the insulating layer film to alternately provide a first spacing and a second spacing larger than the first spacing between stacked units, by using a side wall as a mask pattern, the side wall being formed on a side face of a dummy pattern [formed at a period four times a size of a half pitch F of the bit line of the device], the side wall aligning in a first direction parallel to the major surface, the stacked units including the semiconductor layer and the insulating layer;

forming a film forming the first insulating film, a film forming the charge storage layer, and a film forming the second insulating film on a side face of the stacked unit on the second spacing side, and further forming a gate electrode film forming the gate electrode on the film forming the second insulating film and on a major surface of the stacked unit; and processing the gate electrode film into a band configuration aligning in a second direction parallel to the major surface and non-parallel to the first direction;

wherein the charge storage layer film is separated for each side face of the stacked semiconductor layer on the second spacing side after the processing the gate electrode;

wherein the separating the charge storage layer film includes selectively oxidizing the charge storage layer film by oxidizing via the stacked insulating layer.

2. The method according to claim 1, wherein a side face of the insulating layer on the second spacing side is recessed from a side face of the adjacent stacked semiconductor layer on the second spacing side prior to the processing the gate electrode.

3. A method for manufacturing a nonvolatile semiconductor storage device, the device including: a semiconductor layer; a gate electrode provided facing the semiconductor layer; a charge storage layer provided between the semiconductor layer and the gate electrode; a first insulating film provided between the semiconductor layer and the charge storage layer; and a second insulating film provided between the charge storage layer and the gate electrode, the method comprising:

stacking to form a semiconductor layer film and an insulating layer film on a major surface of a substrate, the semiconductor layer film forming the semiconductor layer, the insulating layer film forming an insulating layer;

processing the semiconductor layer film and the insulating layer film to alternately provide a first spacing and a second spacing larger than the first spacing between stacked units, by using a side wall as a mask pattern, the side wall being formed on a side face of a dummy pattern [formed at a period four times a size of a half pitch F of the bit line of the device], the side wall aligning in a first direction parallel to the major surface, the stacked units including the semiconductor layer and the insulating layer;

forming a film forming the first insulating film, a film forming the charge storage layer, and a film forming the second insulating film on a side face of the stacked unit on the second spacing side, and further forming a gate electrode film forming the gate electrode on the film forming the second insulating film and on a major surface of the stacked unit; and processing the gate electrode film into a band configuration aligning in a second direction parallel to the major surface and non-parallel to the first direction;

wherein the stacking to form the semiconductor layer film and the insulating layer film includes selectively removing an epitaxially grown silicon-germanium film and thermally oxidizing at least a portion of an epitaxially grown silicon film after alternately stacking the epitaxially grown silicon film and the epitaxially grown silicon-germanium film;

wherein the stacking to form the semiconductor layer film and the insulating layer film further includes filling an insulating material between the thermally oxidized epitaxially grown silicon films, the insulating material having an etching rate higher than that of the thermally oxidized epitaxially grown silicon film.

*4. The method according to claim 1, wherein the dummy pattern is formed at a period four times a size of a half pitch of the bit line of the device.*

*5. The method according to claim 3, wherein the dummy pattern is formed at a period four times a size of a half pitch of the bit line of the device.*

* * * * *